United States Patent
Nam et al.

(10) Patent No.: US 11,990,503 B2
(45) Date of Patent: May 21, 2024

(54) METHODS OF FABRICATING CAPACITOR AND SEMICONDUCTOR DEVICE INCLUDING THE CAPACITOR

(71) Applicant: SAMSUNG ELECTRONICS CO., LTD., Suwon-si (KR)

(72) Inventors: Gabjin Nam, Seoul (KR); Youngbin Lee, Suwon-si (KR); Cheoljin Cho, Hwaseong-si (KR); Jaehyoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 17/376,458

(22) Filed: Jul. 15, 2021

(65) Prior Publication Data

US 2022/0216296 A1 Jul. 7, 2022

(30) Foreign Application Priority Data

Jan. 5, 2021 (KR) .................. 10-2021-0001055

(51) Int. Cl.
*H10B 53/30* (2023.01)
*G11C 11/22* (2006.01)
*H01L 49/02* (2006.01)

(52) U.S. Cl.
CPC .......... *H01L 28/60* (2013.01); *H10B 53/30* (2023.02); *G11C 11/22* (2013.01); *H01L 28/55* (2013.01)

(58) Field of Classification Search
CPC ......... H01L 28/60; H01L 28/90; H01L 28/40; H01L 21/02356; H01L 28/55; H10B 53/30; H10B 12/315; H10B 12/03; G11C 11/22
See application file for complete search history.

(56) References Cited

U.S. PATENT DOCUMENTS

| | | | |
|---|---|---|---|
| 5,917,213 A * | 6/1999 | Iyer ................ | H01L 28/84 257/E21.59 |
| 8,531,862 B2 | 9/2013 | Roest et al. | |
| 8,675,337 B2 | 3/2014 | Baniecki et al. | |
| 9,679,893 B2 | 6/2017 | Yan et al. | |
| 10,096,352 B2 | 10/2018 | Khan et al. | |
| 10,515,857 B2 | 12/2019 | Yeh et al. | |
| 2014/0268483 A1* | 9/2014 | Khan ................ | G11C 11/22 428/220 |
| 2017/0365719 A1 | 12/2017 | Chen et al. | |
| 2019/0131420 A1* | 5/2019 | Lu ................ | H01L 29/40111 |
| 2019/0207035 A1 | 7/2019 | Chen et al. | |
| 2020/0013784 A1 | 1/2020 | An et al. | |
| 2020/0013897 A1 | 1/2020 | Park et al. | |
| 2020/0052087 A1 | 2/2020 | Lee et al. | |
| 2020/0135577 A1 | 4/2020 | Yeh et al. | |

FOREIGN PATENT DOCUMENTS

| | | |
|---|---|---|
| JP | H10-11978 A | 1/1998 |
| JP | 3586182 B2 | 11/2004 |
| KR | 10-0685635 B1 | 2/2007 |

* cited by examiner

*Primary Examiner* — Patricia D Valenzuela
(74) *Attorney, Agent, or Firm* — Muir Patent Law, PLLC

(57) ABSTRACT

Provided is a method of fabricating a capacitor. The method of fabricating a capacitor may include forming a first electrode, forming a dielectric layer on the first electrode, forming a second electrode on the dielectric layer, and applying, between the first electrode and the second electrode, a voltage outside an operating voltage range applied during operation or a current outside an operating current range applied during operation.

20 Claims, 14 Drawing Sheets

US 11,990,503 B2

METHODS OF FABRICATING CAPACITOR AND SEMICONDUCTOR DEVICE INCLUDING THE CAPACITOR

CROSS-REFERENCE TO RELATED APPLICATION

Korean Patent Application No. 10-2021-0001055, filed on Jan. 5, 2021 in the Korean Intellectual Property Office, and entitled: "Methods of Fabricating Capacitor and Semiconductor Device Including the Capacitor," is incorporated by reference herein in its entirety.

BACKGROUND

1. Field

Embodiments relate to a method of fabricating a semiconductor device, and more particularly, to methods of fabricating a capacitor and a semiconductor device including the capacitor.

2. Description of the Related Art

Capacitors may store charge. Accordingly, a capacitor may be used to store data in a semiconductor device. An amount of charge stored in a capacitor, that is, a capacitance, may correspond to retention time for the stored data. However, as semiconductor devices become highly integrated, the capacitance thereof may decrease as the area of a capacitor decreases. The capacitance thereof may be proportional to the dielectric constant of a dielectric layer and the area of the capacitor, and may be inversely proportional to the thickness of the dielectric layer. To increase the capacitance of a capacitor, reducing the thickness of a dielectric layer, increasing the dielectric constant of a dielectric layer, and increasing the area of the capacitor have been considered.

SUMMARY

Embodiments are directed to a method of fabricating a capacitor, the method including forming a first electrode, forming a dielectric layer on the first electrode, forming a second electrode on the dielectric layer, and applying, between the first electrode and the second electrode, a voltage outside an operating voltage range applied during operation or a current outside an operating current range applied during operation.

Embodiments are directed to a method of fabricating a capacitor, the method including forming a first electrode, forming a dielectric layer on the first electrode, forming a second electrode on the dielectric layer, and applying a voltage or a current between the first electrode and the second electrode, wherein the voltage applied between the first electrode and the second electrode is applied in a form of a voltage sweep or a voltage pulse having a maximum voltage outside an operating voltage range applied during operation, or the voltage applied between the first electrode and the second electrode is applied in a form of a current sweep or a current pulse having a maximum current outside an operating current range applied during operation.

Embodiments are directed to a method of fabricating a capacitor, the method including forming a first electrode, forming a dielectric layer on the first electrode, forming a second electrode on the dielectric layer, and applying, between the first electrode and the second electrode, a voltage outside an operating voltage range applied during operation or a current outside an operating current range applied during operation, wherein the applying, between the first electrode and the second electrode, of a voltage outside the operating voltage range applied during operation or a current outside the operating current range applied during operation increases a capacitance of the capacitor.

BRIEF DESCRIPTION OF THE DRAWINGS

Features will become apparent to those of skill in the art by describing in detail example embodiments with reference to the attached drawings in which.

DETAILED DESCRIPTION

Figure 1:
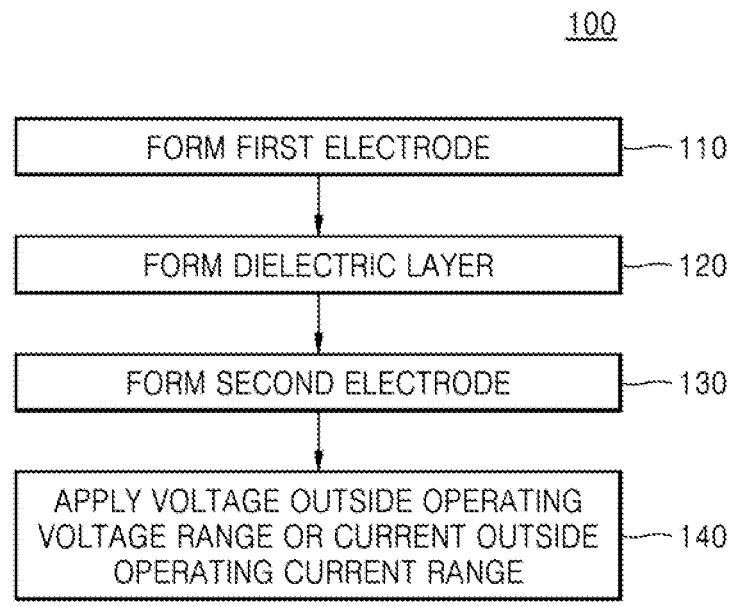
FIG. 1 is a flowchart illustrating a method of fabricating a capacitor, according to an example embodiment.
Figure 2:
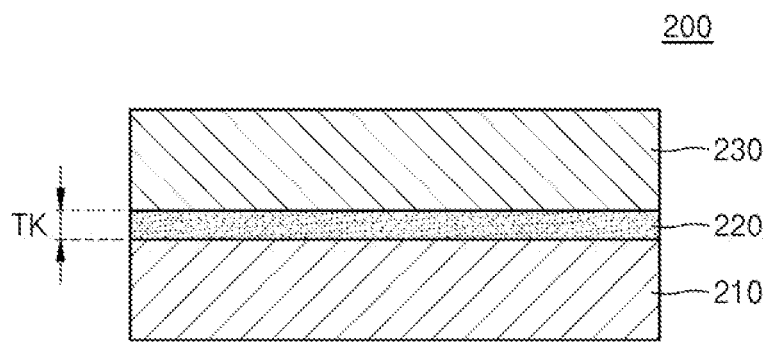
FIG. 2 is a cross-sectional view illustrating a capacitor fabricated according to a method of fabricating a capacitor, according to an example embodiment.

FIG. 1 is a flowchart illustrating a method 100 of fabricating a capacitor, according to an example embodiment. FIG. 2 is a cross-sectional view illustrating a capacitor 200 fabricated according to the method 100 of fabricating a capacitor, according to an example embodiment.

Referring to FIGS. 1 and 2, the method 100 of fabricating a capacitor may include an operation 110 of forming a first electrode 210, an operation 120 of forming a dielectric layer 220 on the first electrode 210, an operation 130 of forming a second electrode 230 on the dielectric layer 220, and an operation 140 of applying a voltage outside an operating voltage range or a current outside an operating current range between the first electrode 210 and the second electrode 230.

The first electrode 210 may include, e.g., a doped semiconductor, a metal, a metal compound, or a combination thereof. In some example embodiments, the first electrode 210 may include titanium nitride (TiN), tungsten nitride (WN), tantalum nitride (TaN), molybdenum nitride (MoN), or a combination thereof. The first electrode 210 may be formed by, e.g., physical vapor deposition (PVD), chemical vapor deposition (CVD), atomic layer deposition (ALD), electroplating, or a combination thereof.

The dielectric layer 220 may be formed by, e.g., PVD, CVD, ALD, or a combination thereof. The dielectric layer 220 may include a high-k material. Here, the high-k material is defined as a material having a higher dielectric constant than that of silicon oxide. For example, the dielectric layer 220 may include hafnium oxide ($HfO_2$), zirconium oxide ($ZrO_2$), aluminum oxide ($Al_2O_3$), lanthanum oxide ($La_2O_3$), tantalum oxide ($Ta_2O_3$), titanium oxide ($TiO_2$), or a combination thereof.

In some example embodiments, the dielectric layer 220 may include a ferroelectric material. For example, the ferroelectric material may include $Hf_xZr_{1-x}O_2$ ($0 \leq x \leq 1$) (or $HfZr_{1-x}O_2$ ($0 \leq x \leq 1$)) doped with at least one of nitrogen (N), tantalum (Ta), silicon (Si), germanium (Ge), lanthanum (La), yttrium (Y), scandium (Sc), strontium (Sr), aluminum (Al), and gadolinium (Gd). The dielectric constant of the dielectric layer 220 including the ferroelectric material may be increased by operation 140 of applying a voltage outside the operating voltage range or a current outside the operating current range.

In some example embodiments, a thickness TK of the dielectric layer 220 may be about 3 nm to about 30 nm. Maintaining the thickness TK of the dielectric layer 220 to about 3 nm or more may help avoid an increase in a leakage current of the capacitor 200 in operation 140 of applying a voltage outside the operating voltage range or a current outside the operating current range. Maintaining the thickness TK of the dielectric layer 220 to be about 30 nm or less may help avoid an unwanted decrease in the capacitance of the capacitor 200.

The second electrode 230 may be formed by, e.g., PVD, CVD, ALD, electroplating, or a combination thereof. The second electrode 230 may include, e.g., a doped semiconductor, a metal, a metal compound, or a combination thereof. In some example embodiments, the second electrode 230 may include TiN, WN, TaN, MoN, or a combination thereof.

In some example embodiments, the method 100 of fabricating a capacitor may further include an operation (not shown) of performing heat treatment on the dielectric layer 220 to crystallize the dielectric layer 220. The operating of performing heat treatment may be performed, e.g., between operation 120 of forming the dielectric layer 220 and operation 130 of forming the second electrode 230, or between operation 130 of forming the second electrode 230 and operation 140 of applying a voltage outside the operating voltage range or a current outside the operating current range. The temperature of the heat treatment may be, e.g., about 400° C. to about 1000° C. Through the heat treatment, the dielectric layer 220 may be crystallized to form at least one of a phase having a high dielectric constant in the dielectric layer 220 (e.g., a tetragonal phase (T-phase)) and a phase having ferroelectric characteristics, (e.g., an orthorhombic phase (O-phase)). Accordingly, through the heat treatment, the dielectric constant of the dielectric layer 220 may be increased, and the ferroelectric characteristics of the dielectric layer 220 may be increased.

After the first electrode 210, the dielectric layer 220, and the second electrode 230 are formed, a voltage outside the operating voltage range or a current outside the operating current range may be applied between, e.g., across, the first electrode 210 and the second electrode 230 in operation 140. The operating voltage range and the operating current range are defined as ranges of a voltage and a current applied to the capacitor 200 when the capacitor 200 is used after the capacitor 200 is fabricated. In some example embodiments, the operating voltage range may be about –0.5 V to about 0.5 V.

Operation 140 of applying a voltage outside the operating voltage range or a current outside the operating current range may increase the dielectric constant of the dielectric layer 220. Accordingly, operation 140 of applying a voltage outside the operating voltage range or a current outside the operating current range may increase the capacitance of the capacitor 200. For example, the capacitance of the capacitor 200 may be increased by more than 0% and less than 10%. The capacitance of the capacitor 200 may be increased by more than 10%, but doing so may involve applying a high voltage to the capacitor 200, and the dielectric layer 220 may be damaged, and thus, a leakage current of the capacitor 200 may be increased.

In some example embodiments, operation 140 of applying a voltage outside the operating voltage range or a current outside the operating current range may increase a proportion of a particular crystal phase in the dielectric layer 220. For example, operation 140 of applying a voltage outside the operating voltage range or a current outside the operating current range may increase a proportion of at least one of the O-phase and the T-phase. Because the O-phase exhibits ferroelectricity, an increase in the O-phase may cause an increase in hysteresis after operation 140 of applying a voltage outside the operating voltage range or a current outside the operating current range. An increase in the T-phase may cause an increase in dielectric constant after operation 140 of applying a voltage outside the operating voltage range or a current outside the operating current range. In some example embodiments, after operation 140 of applying a voltage outside the operating voltage range or a current outside the operating current range, a proportion of the O-phase in the dielectric layer 220 may be about 30% to about 100%.

In some example embodiments, operation 140 of applying a voltage outside the operating voltage range or a current outside the operating current range may not increase the leakage current of the capacitor 200 by 10 times or more. In some example embodiments, to prevent, due to operation 140 of applying a voltage outside the operating voltage range or a current outside the operating current range, the dielectric layer 220 from being damaged and the leakage current from being increased by 10 times or more when the capacitor 200 is used, operation 140 of applying a voltage outside the operating voltage range or a current outside the operating current range may be performed under a condition that the magnitude of the leakage current does not fall outside of a predetermined range. For example, the predetermined range may be about 2 femtoamperes (fA) to about 1 picoampere (pA). When the magnitude of a maximum leakage current is less than 2 fA in operation 140 of applying a voltage outside the operating voltage range or a current outside the operating current range, a sufficiently high voltage may not be applied to the capacitor 200 for a sufficient time, and thus, an increase in capacitance of the capacitor 200 may be lower than desired. When the magnitude of the maximum leakage current is greater than 1 pA, the dielectric layer 220 may be damaged, and the leakage current may increase 10 times or more when the capacitor 200 is used.

In some example embodiments, the dielectric layer 220 may include a ferroelectric material, and the coercive voltage of the ferroelectric material may be outside the operating voltage range. In operation 140 of applying a voltage outside the operating voltage range or a current outside the operating current range, a voltage greater than the coercive voltage of the ferroelectric material may be applied to the capacitor 200. Accordingly, when a voltage sweep having a maximum voltage within the operating voltage range is applied, the capacitor 200 may not exhibit hysteresis, and when a voltage sweep having a maximum voltage outside the operating voltage range is applied, the capacitor 200 may exhibit hysteresis.

In some example embodiments, in operation 140 of applying a voltage outside the operating voltage range or a current outside the operating current range, a voltage sweep or a voltage pulse having a maximum voltage outside the operating voltage range or a current sweep or a current pulse having a maximum current outside the operating current range may be applied to the capacitor 200.

In some example embodiments, the maximum voltage may be greater than 0.5 V and less than or equal to 5 V. When the maximum voltage is less than 0.5 V, the capacitance of the capacitor 200 may not be increased by applying the voltage sweep or the voltage pulse. When the maximum voltage is greater than 5 V, the dielectric layer 220 may be damaged by the voltage, and the leakage current may be increased when the capacitor 200 is used.

In some example embodiments, the maximum current may be about 5 pA to about 50 milliamperes (mA). When the maximum current is less than 5 pA, the capacitance of the capacitor 200 may not be increased by the current sweep or the current pulse. When the maximum current is greater than or equal to 50 mA, the dielectric layer 220 may be damaged by the current, and the leakage current may be increased when the capacitor 200 is used.

In some example embodiments, a time when the voltage sweep, the voltage pulse, the current sweep, or the current pulse is applied to the capacitor 200 may be about 1 nanosecond (ns) to about 1 second (s). When the time when the voltage sweep, the voltage pulse, the current sweep, or the current pulse is applied is less than 1 ns, the capacitance of the capacitor 200 may not be increased by the application of the voltage sweep, the voltage pulse, the current sweep, or the current pulse. When the time of which the voltage sweep, the voltage pulse, the current sweep, or the current pulse is applied is greater than 1 s, the dielectric layer 220 may be damaged, and the leakage current may be increased when the capacitor 200 is used.

FIGS. 3A to 3E are graphs each showing a voltage or a current applied to a capacitor in a method of fabricating a capacitor, according to example embodiments.

Figure 3A:
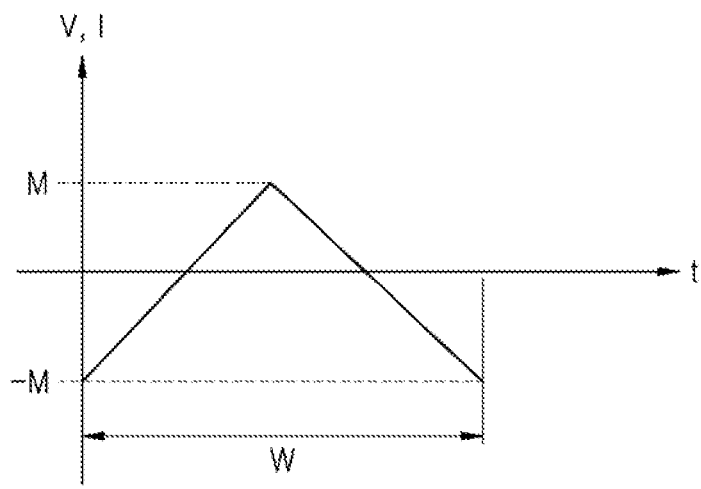
FIGS. 3A to 3E are graphs each showing a voltage or a current applied to a capacitor in a method of fabricating a capacitor, according to example embodiments.

FIG. 3A is a graph of a voltage sweep or a current sweep having a maximum voltage M outside an operating voltage range. The voltage sweep or the current sweep may be applied to a capacitor over time W. For example, a voltage or a current may increase from a minimum value −M to the maximum value M, and may decrease from the maximum value M to the minimum value −M. However, the shape of the voltage sweep or the current sweep graph may vary from that shown in FIG. 3A. For example, a voltage or a current may increase from 0 to the maximum value M, decrease from the maximum value M to the minimum value −M, and increase from the minimum value −M to 0. In another example embodiment, a voltage or a current may decrease from the maximum value M to the minimum value −M, and increase from the minimum value −M to the maximum value M. In addition, absolute values of the maximum value M and the minimum value −M may be the same or different.

Figure 3B:
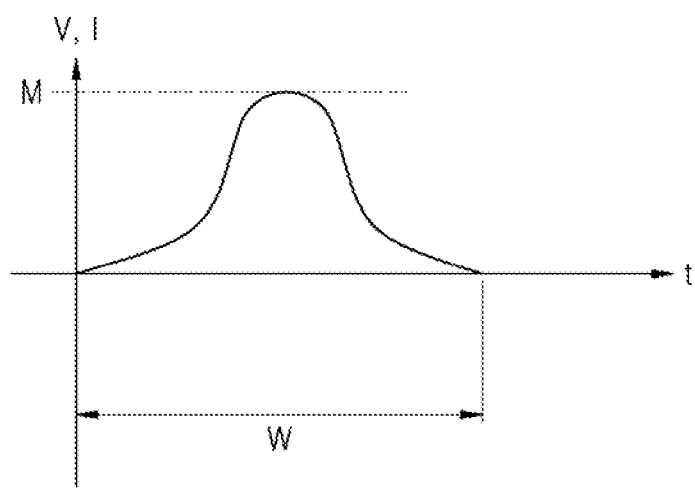
Figure 3C:
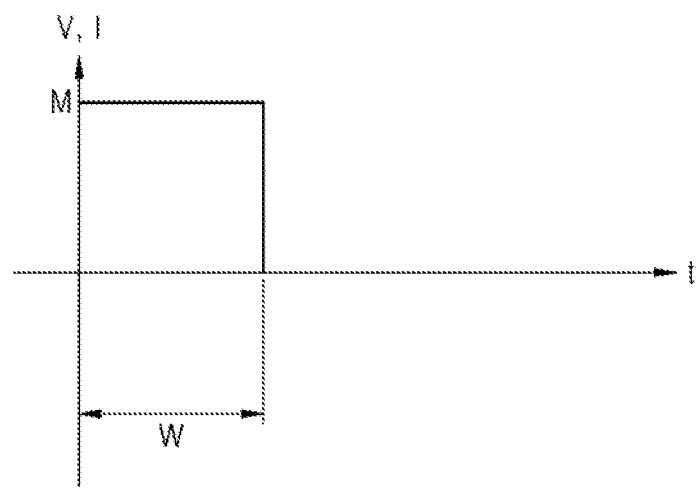
Figure 3D:
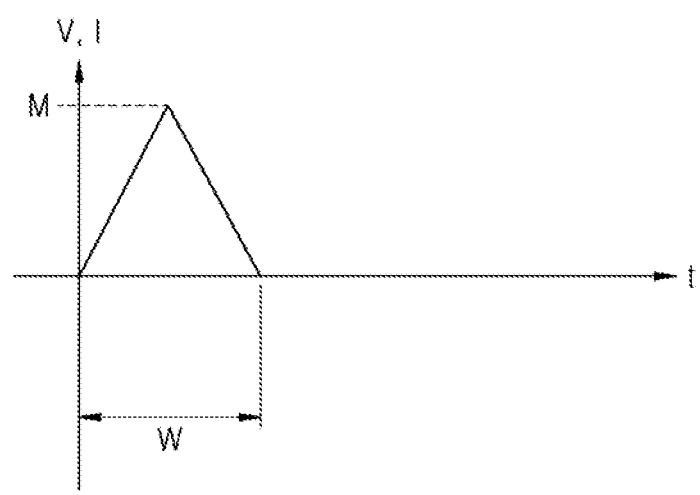
Figure 3E:
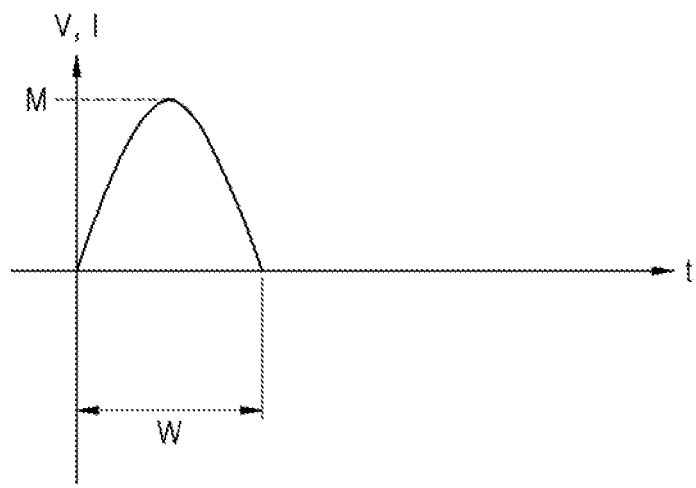

FIG. 3B is a graph of a voltage pulse or a current pulse having a maximum voltage M outside the operating voltage range. The voltage pulse or the current pulse may be applied to a capacitor over time W. The shape of the pulse graph may be varied from that shown in FIG. 3B. For example, a square pulse as shown in FIG. 3C, a triangular pulse as shown in FIG. 3D, or a trigonometric pulse as shown in FIG. 3E may be used.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXPERIMENTAL EXAMPLE 1

A first electrode, a dielectric layer, and a second electrode were sequentially formed.

Figure 4A:
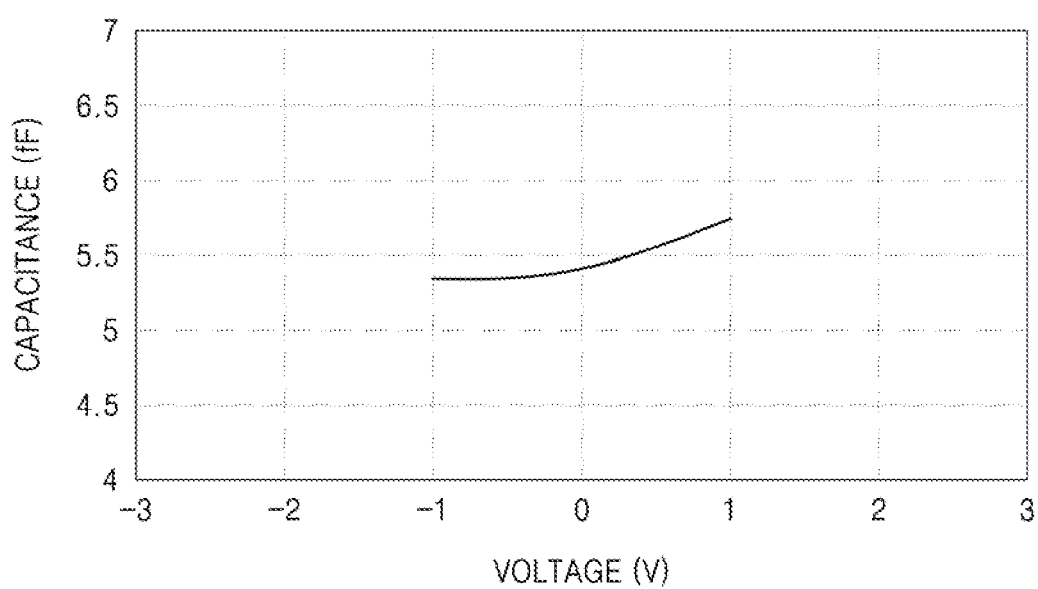
FIGS. 4A to 4E are graphs each showing a capacitance according to a voltage sweep having a maximum voltage outside an operating voltage range.
Figure 4B:
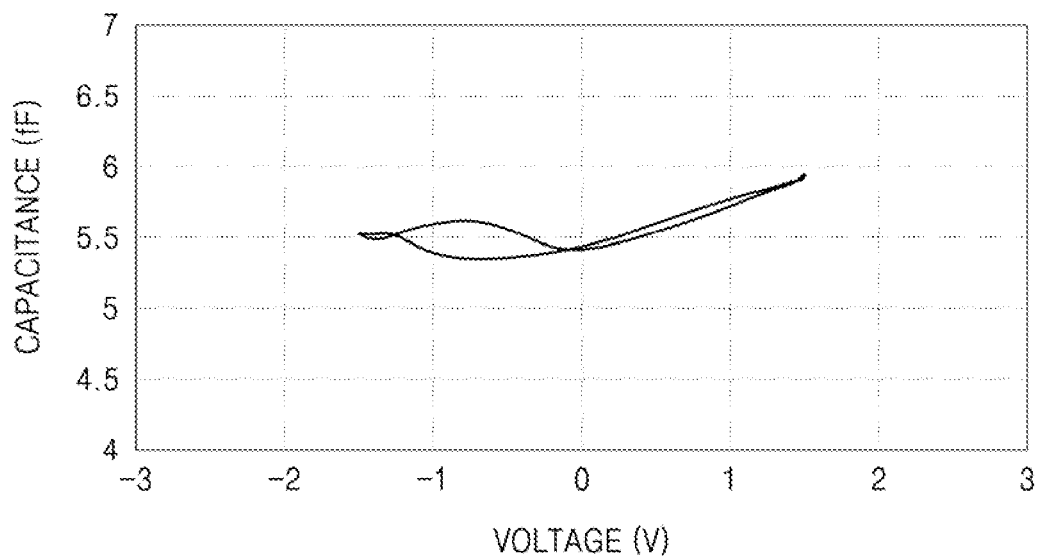
Figure 4C:
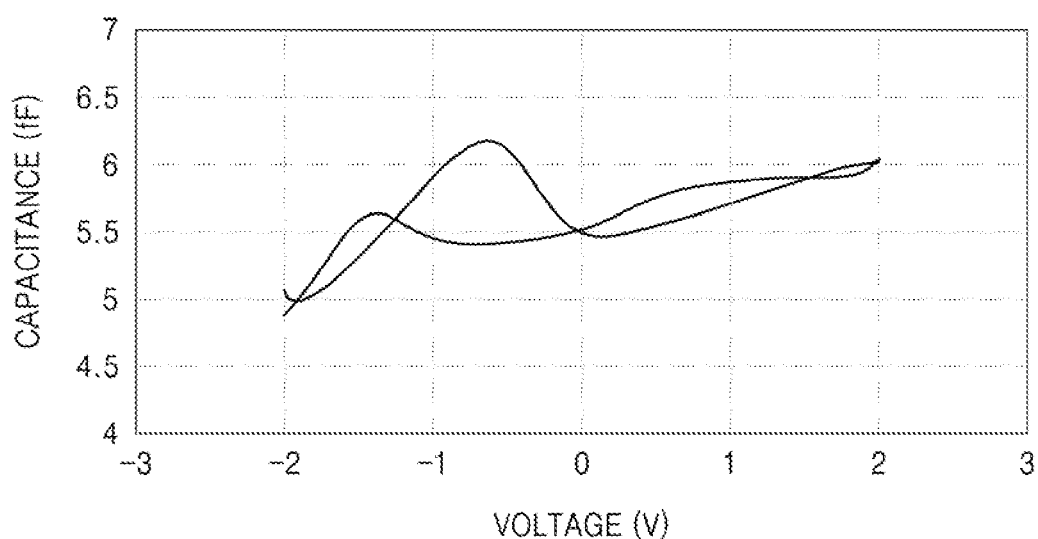
Figure 4D:
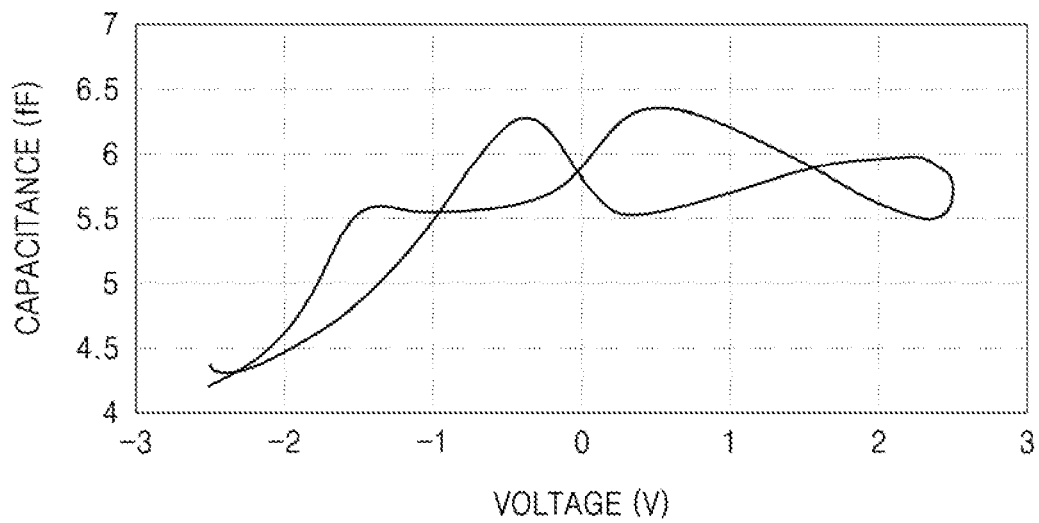
Figure 4E:
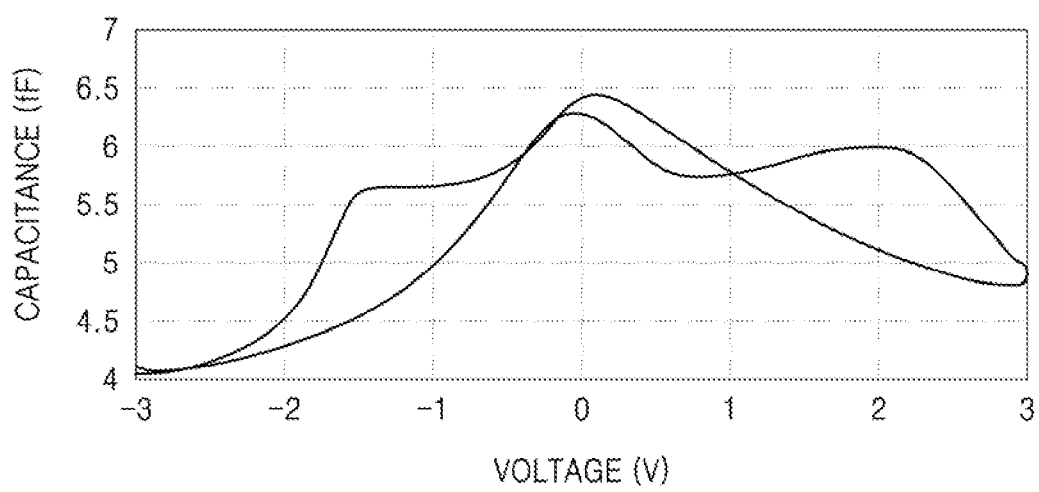
Figure 5:
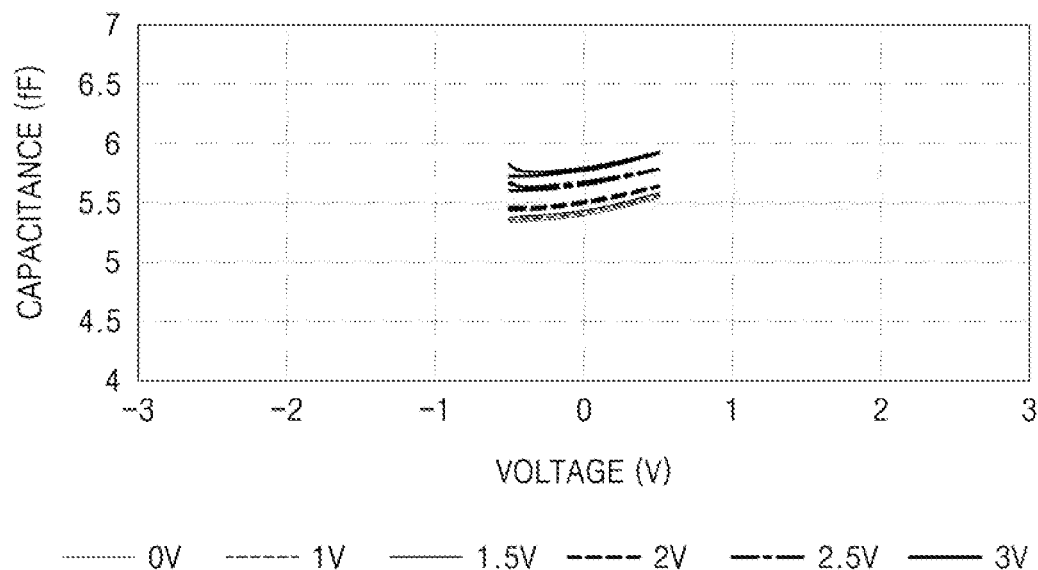
FIG. 5 is a graph showing capacitances according to voltage sweeps within an operating voltage range.
Figure 6:
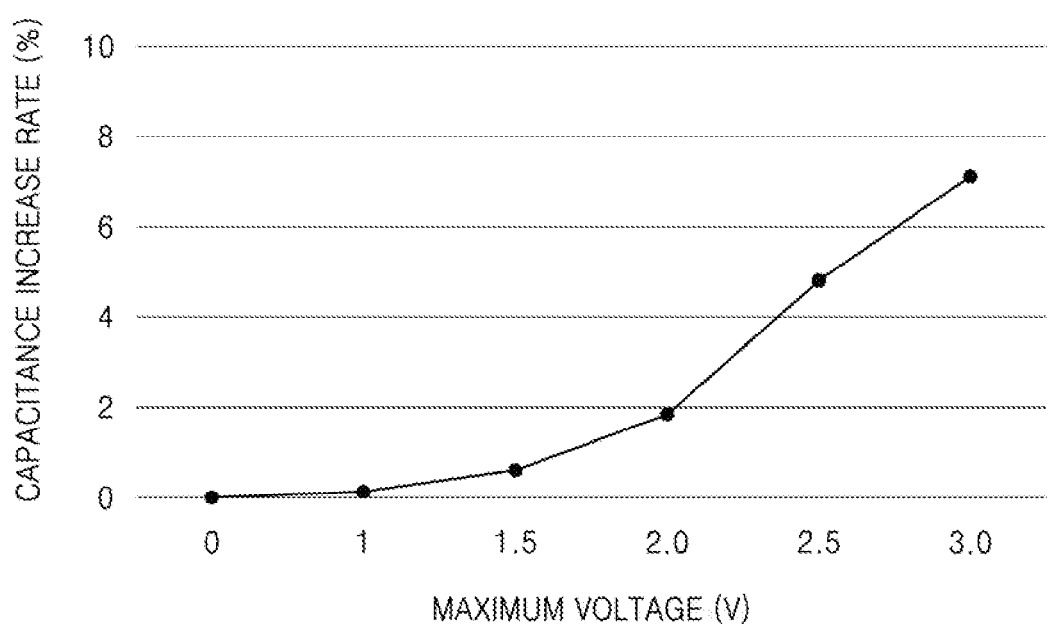
FIG. 6 is a graph showing an increase rate of a capacitance according to a maximum voltage.

FIGS. 4A to 4E are graphs each showing a capacitance according to a voltage sweep having a maximum voltage outside an operating voltage range. FIG. 5 is a graph showing capacitances according to voltage sweeps within an operating voltage range. FIG. 6 is a graph showing an increase rate of a capacitance according to a maximum voltage.

The capacitance of a capacitor was measured while a voltage sweep within an operating range (−0.5 V to 0.5 V) was applied to the capacitor. (0 V line of FIG. 5)

The capacitance of the capacitor was measured while a voltage sweep having a maximum voltage of 1 V was applied to the capacitor. (FIG. 4A)

The capacitance of the capacitor was measured while a voltage sweep within an operating range (−0.5 V to 0.5 V) was applied to the capacitor. (1 V line of FIG. 5)

The capacitance of the capacitor was measured while a voltage sweep having a maximum voltage of 1.5 V was applied to the capacitor. (FIG. 4B)

The capacitance of the capacitor was measured while a voltage sweep within an operating range (−0.5 V to 0.5 V) was applied to the capacitor. (1.5 V line of FIG. 5)

The capacitance of the capacitor was measured while a voltage sweep having a maximum voltage of 2 V was applied to the capacitor. (FIG. 4C)

The capacitance of the capacitor was measured while a voltage sweep within an operating range (−0.5 V to 0.5 V) was applied to the capacitor. (2 V line of FIG. 5)

The capacitance of the capacitor was measured while a voltage sweep having a maximum voltage of 2.5 V was applied to the capacitor. (FIG. 4D)

The capacitance of the capacitor was measured while a voltage sweep within an operating range (−0.5 V to 0.5 V) was applied to the capacitor. (2.5 V line of FIG. 5)

The capacitance of the capacitor was measured while a voltage sweep having a maximum voltage of 3 V was applied to the capacitor. (FIG. 4E)

The capacitance of the capacitor was measured while a voltage sweep within an operating range (−0.5 V to 0.5 V) was applied to the capacitor. (3 V line of FIG. 5)

Results of Experimental Example 1

Referring to FIGS. 4A to 4E, as the maximum voltage of the maximum sweep increases from 1 V to 3 V from FIG. 4A to FIG. 4E, the hysteresis of the voltage-capacitance curve increases. This shows that as the maximum voltage of a voltage sweep applied to a capacitor increases, a dielectric layer exhibits ferroelectric characteristics or the switching to a ferroelectric phase in the dielectric layer increases. The increase in hysteresis may be due to an increase of the O-phase indicating the ferroelectric characteristic in the dielectric layer. Thus, when a voltage sweep having a maximum voltage outside an operating voltage range is applied, crystal redistribution in a dielectric layer may occur, and a proportion of the O-phase in the dielectric layer may increase.

Referring to FIG. 5, even after a voltage sweep having a maximum voltage outside an operating voltage range is applied, the voltage-capacitance curve may not exhibit hysteresis when a voltage sweep within the operating voltage range is applied. Instead, after a voltage sweep having a maximum voltage outside the operating voltage range is applied (1 V line, 1.5 V line, 2 V line, 2.5 V line, and 3 V line of FIG. 5), the capacitance was increased, compared to the case before the voltage sweep having the maximum voltage outside the operating voltage range is applied (0 V line of FIG. 5). This may be because when the voltage sweep having the maximum voltage outside the operating voltage range was applied, crystal redistribution in the dielectric layer occurred, and the proportion of the T-phase was increased. Because the T-phase exhibits a high dielectric constant, an increase in the T-phase may be correlated with the increase in capacitance.

FIG. 6 is a graph in which a capacitance increase rate of a capacitor is calculated after a maximum voltage outside the operating voltage range is applied (1 V line, 1.5 V line, 2 V line, 2.5 V line, and 3 V line of FIG. 5) when a voltage of 0 V is applied, based on a capacitance of a capacitor before a voltage sweep having a maximum voltage outside the operating voltage range is applied (0 V line of FIG. 5) when the voltage of 0 V is applied in FIG. 5. Referring to FIG. 6, the capacitance of the capacitor may increase as the maximum voltage increases.

EXPERIMENTAL EXAMPLE 2

A first electrode, a dielectric layer, and a second electrode were sequentially formed.

Figure 7:
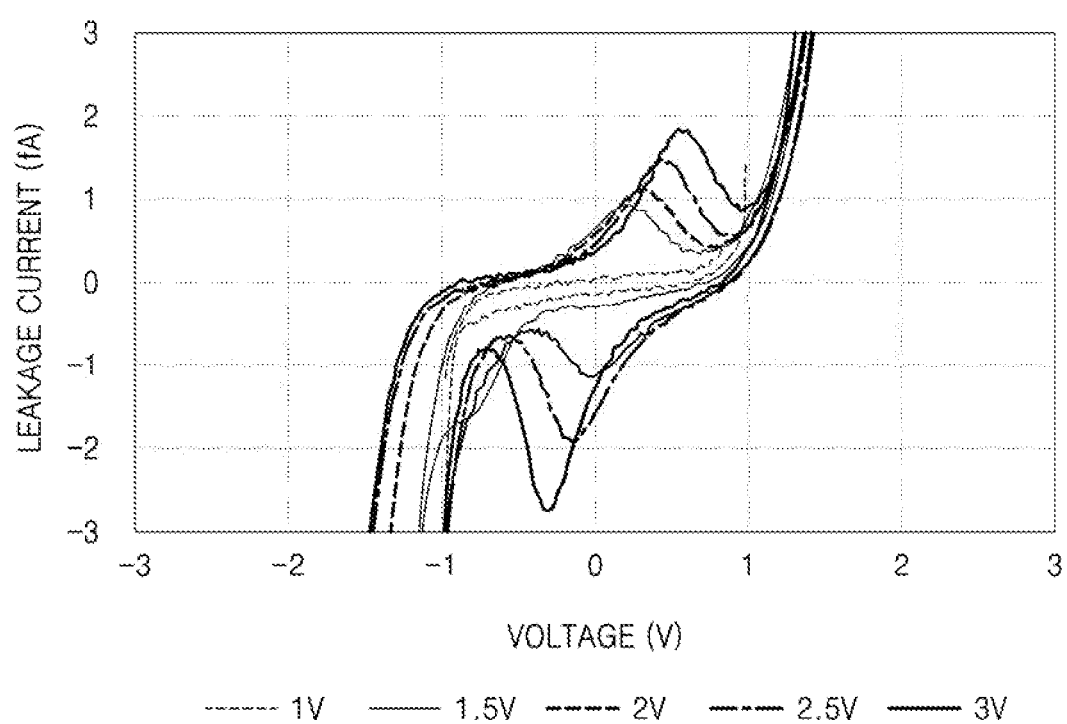
FIG. 7 is a graph showing leakage currents according to voltage sweeps having a maximum voltage outside an operating voltage range.
Figure 8:
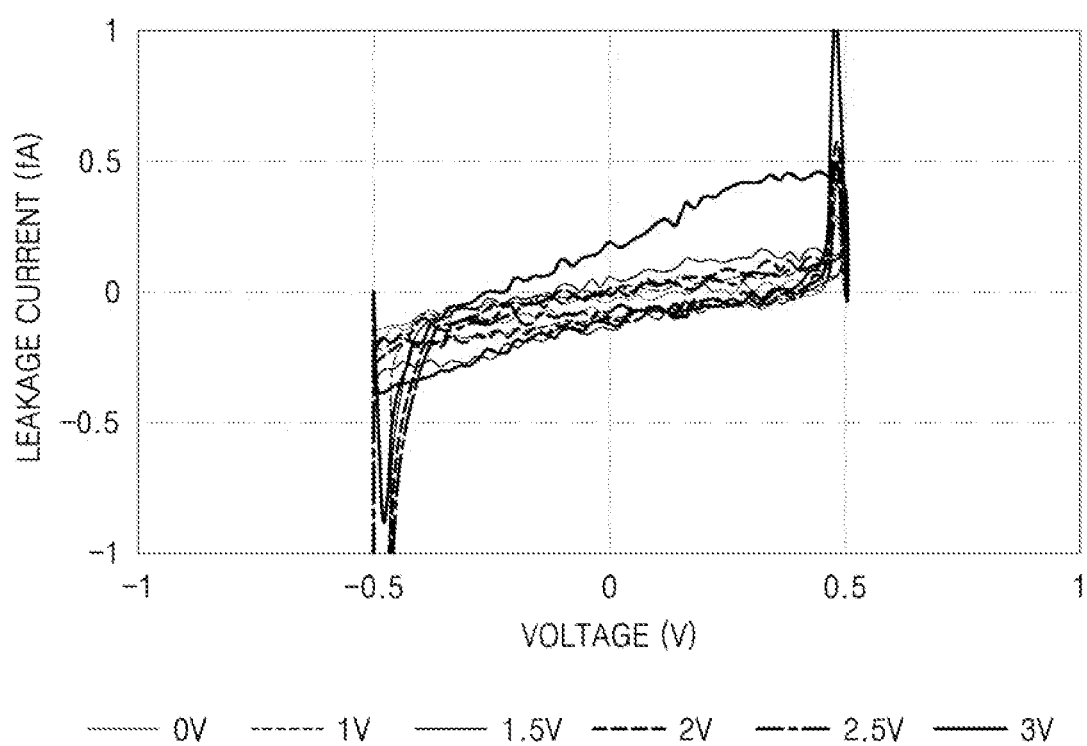
FIG. 8 is a graph showing leakage currents according to voltage sweeps within an operating voltage range.
Figure 9:
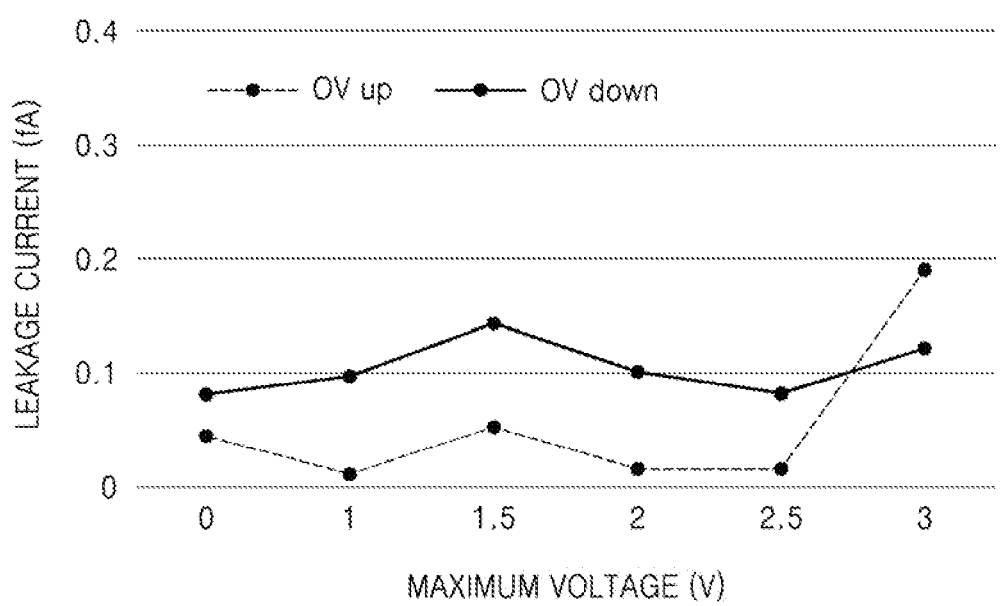
FIG. 9 is a graph showing a leakage current according to a maximum voltage.

FIG. 7 is a graph showing leakage currents according to voltage sweeps having a maximum voltage outside an operating voltage range. FIG. 8 is a graph showing leakage currents according to voltage sweeps within an operating voltage range. FIG. 9 is a graph showing a leakage current according to a maximum voltage.

A condition was set in which the maximum leakage current did not exceed 0.5 pA.

The leakage current of a capacitor was measured while a voltage sweep within an operating range (−0.5 V to 0.5 V) was applied to the capacitor. (0 V line of FIG. 8)

The leakage current of the capacitor was measured while a voltage sweep having a maximum voltage of 1 V was applied to the capacitor. (1 V line of FIG. 7)

The leakage current of the capacitor was measured while a voltage sweep within an operating range (−0.5 V to 0.5 V) was applied to the capacitor. (1 V line of FIG. 8)

The leakage current of the capacitor was measured while a voltage sweep having a maximum voltage of 1.5 V was applied to the capacitor. (1.5 V line of FIG. 7)

The leakage current of the capacitor was measured while a voltage sweep within an operating range (−0.5 V to 0.5 V) was applied to the capacitor. (1.5 V line of FIG. 8)

The leakage current of the capacitor was measured while a voltage sweep having a maximum voltage of 2 V was applied to the capacitor. (2 V line of FIG. 7)

The leakage current of the capacitor was measured while a voltage sweep within an operating range (−0.5 V to 0.5 V) was applied to the capacitor. (2 V line of FIG. 8)

The leakage current of the capacitor was measured while a voltage sweep having a maximum voltage of 2.5 V was applied to the capacitor. (2.5 V line of FIG. 7)

The leakage current of the capacitor was measured while a voltage sweep within an operating range (−0.5 V to 0.5 V) was applied to the capacitor. (2.5 V line of FIG. 8)

The leakage current of the capacitor was measured while a voltage sweep having a maximum voltage of 3 V was applied to the capacitor. (3 V line of FIG. 7)

The leakage current of the capacitor was measured while a voltage sweep within an operating range (−0.5 V to 0.5 V) was applied to the capacitor. (3 V line of FIG. 8)

Results of Experimental Example 2

Referring to FIG. 7, the leakage current according to a voltage sweep having a maximum voltage outside an operating voltage range may indicate hysteresis. Thus, a dielectric layer may exhibit ferroelectric characteristics. Hysteresis may increase as the maximum voltage increases from 1 V to 3 V. This shows that as the maximum voltage of a voltage sweep applied to a capacitor increases, a dielectric layer exhibits ferroelectric characteristics or the switching to a ferroelectric phase in the dielectric layer increases. The increase in hysteresis may be due to an increase of the O-phase indicating the ferroelectric characteristic in the dielectric layer. Thus, when a voltage sweep having a maximum voltage outside an operating voltage range is applied, crystal redistribution in a dielectric layer may occur, and a proportion of the O-phase in the dielectric layer may increase.

Referring to FIG. 8, even after a voltage sweep having a maximum voltage outside an operating voltage range is applied, the leakage current may not increase significantly when a voltage sweep within the operating voltage range is applied (1 V line, 1.5 V line, 2 V line, and 3 V line of FIG. 8), compared to a case before a voltage sweep having a maximum voltage outside the operating voltage range is applied (0 V line of FIG. 8). This may be because the leakage current is suppressed to 0.5 pA or less when a voltage sweep having a maximum voltage outside the operating voltage range is applied.

FIG. 9 is a graph showing a leakage current of a capacitor when a voltage of 0 V is applied in FIG. 8 before a voltage sweep having a maximum voltage outside an operating voltage range is applied (0 V line of FIG. 8) and a leakage current of a capacitor when a voltage of 0 V is applied in FIG. 8 after a maximum voltage outside the operating voltage range is applied (1 V line, 1.5 V line, 2 V line, 2.5 V line, and 3 V line of FIG. 5). In FIG. 9, 0 V up means a leakage current when 0 V is applied to a capacitor while a voltage is increasing from −0.5 V to 0.5 V. Further, 0 V down represents a leakage current when 0 V is applied to a capacitor while a voltage is decreasing from 0.5 V to −0.5 V. Referring to FIG. 9, a leakage current of a capacitor may not increase by 10 times or more than before a voltage sweep having a maximum voltage outside the operating voltage range is applied (maximum voltage 0 V).

Figure 10A:
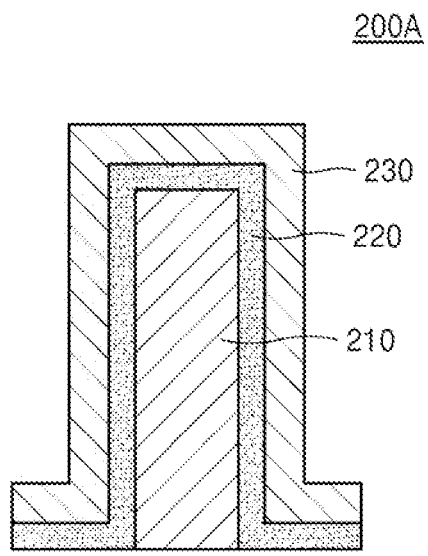
FIGS. 10A to 10C are cross-sectional views illustrating capacitors fabricated according to methods of fabricating a capacitor according to example embodiments.
Figure 10B:
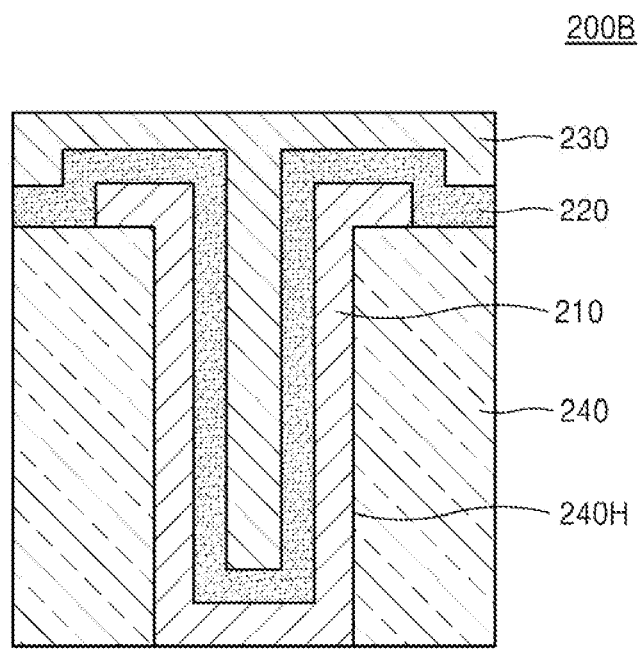
Figure 10C:
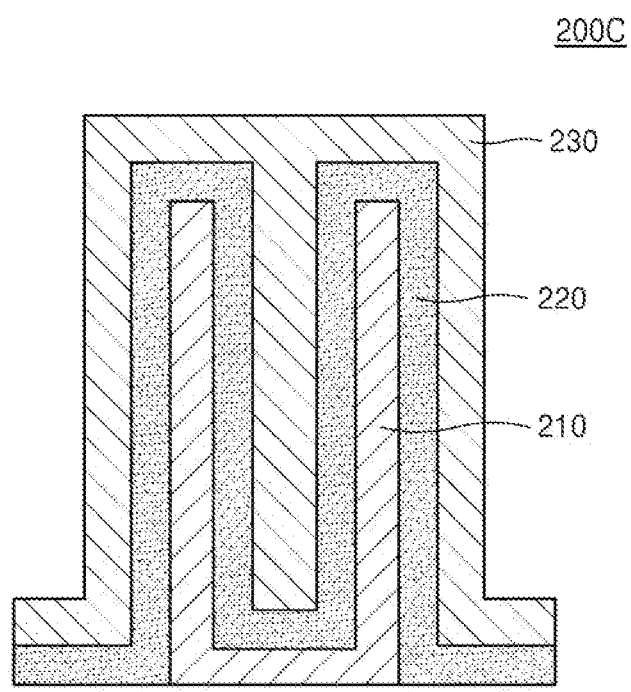

FIGS. 10A to 10C are cross-sectional views illustrating capacitors 200A, 200B, and 200C fabricated by methods of fabricating a capacitor according to example embodiments.

As shown in FIGS. 10A to 10C, the method 100 of fabricating a capacitor described with reference FIG. 1 may be used to fabricate the capacitors 200A, 200B, and 200C having various shapes, in addition to the capacitor 200 having a plane shape shown in FIG. 2.

Referring to FIG. 10A, the first electrode 210 may be formed to have a pillar shape. The dielectric layer 220 may be formed to cover an upper surface and side surfaces of the first electrode 210 with a constant thickness. The second electrode 230 may be formed to cover the dielectric layer 220. Then, a voltage outside an operating voltage range or a current outside an operating current range may be applied between the first electrode 210 and the second electrode 230.

Referring to FIG. 10B, the capacitor 200B may further include an insulating layer 240. Thus, a method of fabricating a capacitor may further include an operation of forming the insulating layer 240 before forming the first electrode 210. A hole 240H penetrating the insulating layer 240 in a vertical direction may be formed in the insulating layer 240. The first electrode 210 may be formed to cover an inner side surface of the hole 240H of the insulating layer 240. In some example embodiments, the first electrode 210 may be formed to further cover a portion of an upper surface of the insulating layer 240. The first electrode 210 may be formed to include a bottom portion, an intermediate portion extending from the bottom portion in the vertical direction and positioned on an inner side surface of the hole 240H of the insulating layer 240, and an upper portion on the upper surface of the insulating layer 240. The dielectric layer 220 may be formed to cover inner side surfaces and upper surfaces of the first electrode 210 and the upper surface of the insulating layer 240 with a constant thickness. The second electrode 230 may be formed to cover the dielectric layer 220. Then, a voltage outside an operating voltage range or a current outside an operating current range may be applied between the first electrode 210 and the second electrode 230.

Referring to FIG. 10C, the first electrode 210 may be formed in a hollow cylinder shape. For example, the first electrode 210 may include a bottom portion and side wall portions extending from the bottom portion in a vertical direction. The dielectric layer 220 may be formed to cover an upper surface of the first electrode 210 and inner side surfaces, upper side surfaces, and outer side surfaces of the side wall portions of the first electrode 210 with a constant thickness. The second electrode 230 may be formed to cover the dielectric layer 220. Then, a voltage outside an operating voltage range or a current outside an operating current range may be applied between the first electrode 210 and the second electrode 230.

Figure 11A:
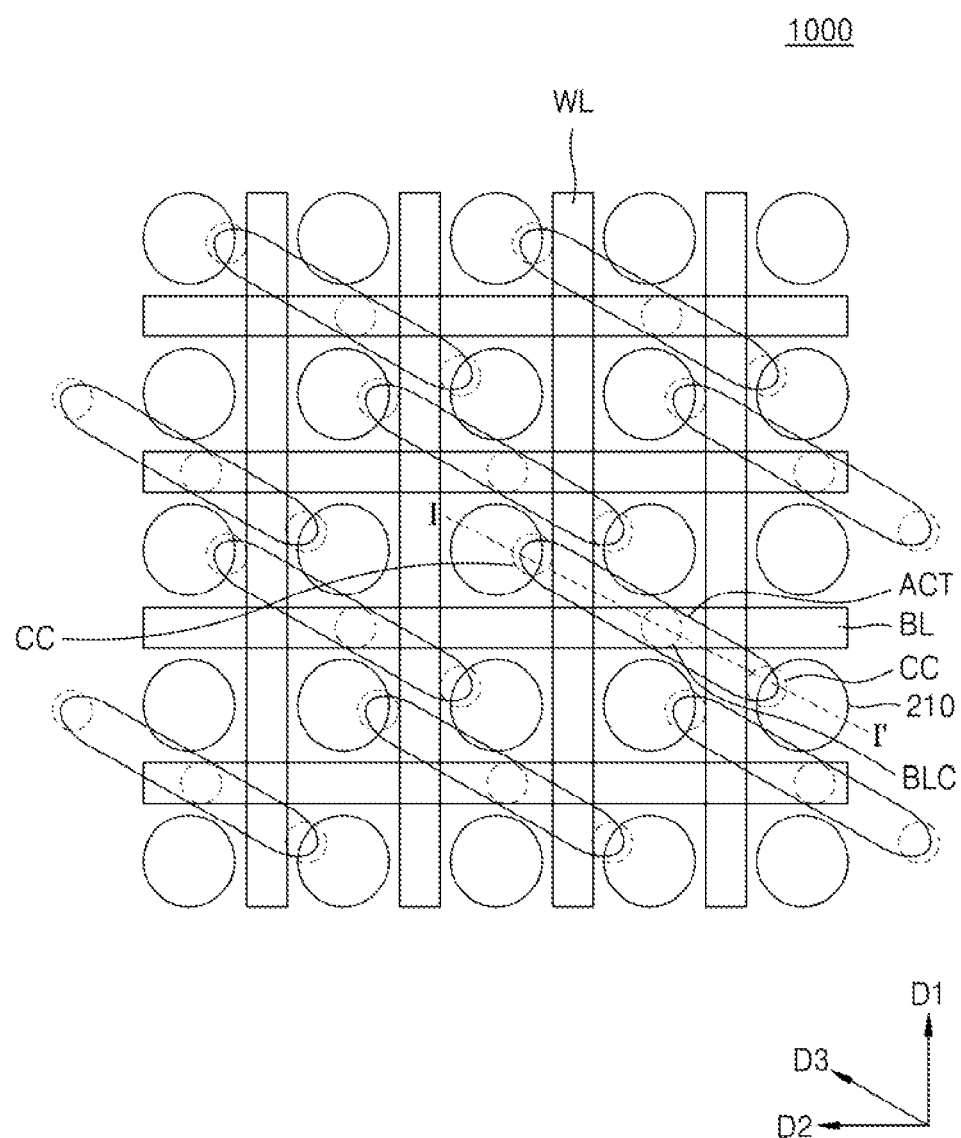
FIG. 11A is a plan view illustrating a semiconductor device fabricated according to a method of fabricating a semiconductor device including a capacitor, according to example embodiments.
Figure 11B:
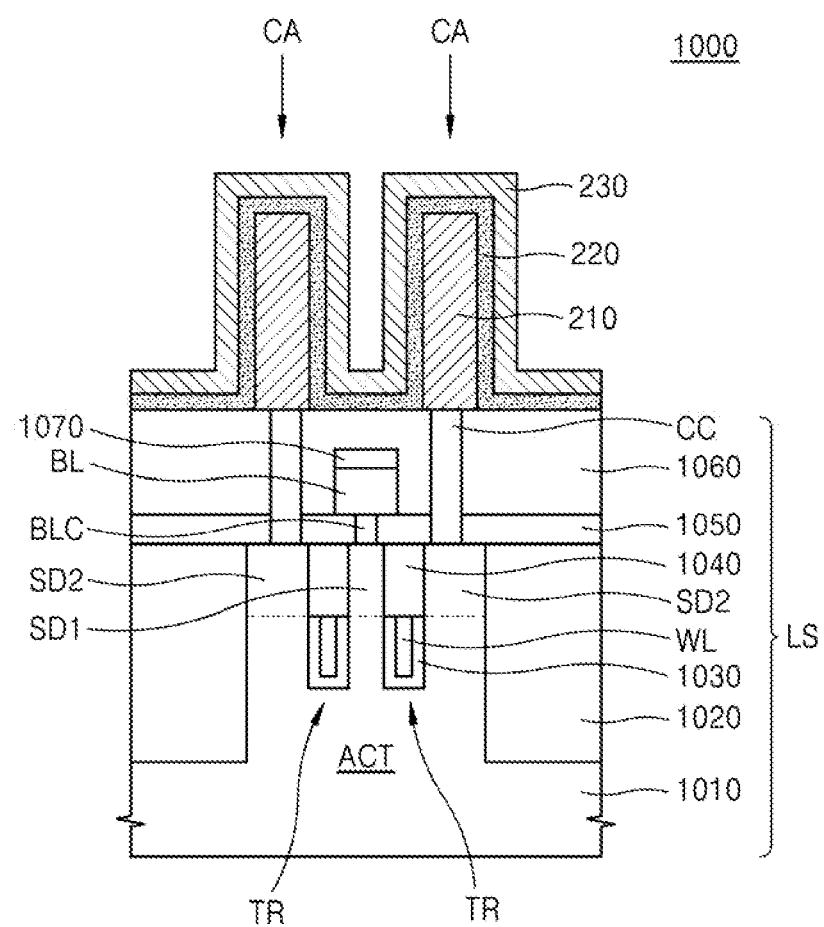
FIG. 11B is a cross-sectional view, taken along line I-I' of FIG. 11A, of a semiconductor device fabricated according to a method of fabricating a semiconductor device including a capacitor, according to example embodiments.

FIG. 11A is a plan view illustrating a semiconductor device 1000 fabricated according to a method of fabricating a semiconductor device including a capacitor, according to example embodiments. FIG. 11B is a cross-sectional view, taken along line I-I' of FIG. 11A, of the semiconductor device 1000 fabricated according to a method of fabricating a semiconductor device including a capacitor, according to example embodiments.

Referring to FIGS. 11A and 11B, in some example embodiments, the semiconductor device 1000 may be, e.g., a memory device such as dynamic random-access memory (DRAM). The semiconductor device 1000 may include a lower structure LS and a plurality of capacitors CA on the lower structure LS. Each of the plurality of capacitors CA may be the same as one of the capacitors 200A to 200C shown in FIGS. 10A to 10C.

Current values such as an applied current and a leakage current described herein are defined as currents flowing through each of the plurality of capacitors CA. Accordingly, the current values described herein are values obtained by dividing the current flowing through the semiconductor device 1000 by the number of capacitors CA included in the semiconductor device 1000. In addition, a capacitance value described herein is defined as the capacitance of one of the plurality of capacitors CA.

In some example embodiments, the plurality of capacitors CA in the semiconductor device 1000 may share the second electrode 230. Thus, the second electrodes 230 of the plurality of capacitors CA may be integrally formed. In some example embodiments, the plurality of capacitors CA in the semiconductor device 1000 may share the dielectric layer 220. Thus, the dielectric layers 220 of the plurality of capacitors CA may be integrally formed. However, the first electrodes 210 of the plurality of capacitors CA may be apart from each other. For example, one of the plurality of capacitors CA may include a corresponding first electrode 210, a portion of the dielectric layer 220, and a portion of the second electrode 230.

The lower structure LS may include a plurality of transistors TR, a plurality of word lines WL, and a plurality of bit lines BL. Each of the plurality of transistors TA may be connected to each of the plurality of capacitors CA.

A device separation film 1020 defining a plurality of active regions ACT in a substrate 1010 may be formed. The substrate 1010 may include a semiconductor material such as a Group IV semiconductor material, a Group III-V semiconductor material, or a Group II-VI semiconductor material. The Group IV semiconductor material may include, e.g., silicon (Si), germanium (Ge), or silicon germanium (SiGe). The Group III-V semiconductor material may include, e.g., gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, e.g., zinc telluride (ZnTe) or cadmium sulfide (CdS). The substrate 1010 may include, e.g., a bulk wafer or an epitaxial layer.

The device separation film 1020 may include, e.g., silicon oxide, silicon nitride, silicon oxynitride, or a combination thereof. From a plan view, each of the plurality of active regions ACT may be formed in an island shape having a long axis in a third direction D3.

A gate insulating layer 1030, each of the plurality of word lines WL, and a word line capping layer 1040 may be formed in a recess that crosses the active region ACT and extends in a first direction D1. The gate insulating layer 1030 may be formed on the bottom and side surfaces of the recess. The gate insulating layer 1030 may be formed between the word line WL and the active region ACT.

The gate insulating layer 1030 may include, e.g., silicon oxide, silicon nitride, silicon oxynitride, a high-k material, or a combination thereof. The high-k material may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The word line WL may be formed on the gate insulating layer 1030 in a lower portion of the recess. Each of the plurality of word lines WL may include a conductive material. Each of the plurality of word lines WL may include, e.g., polysilicon, a metal, a metal nitride, or a combination thereof. For example, the word line WL may include doped polysilicon, titanium nitride (TiN), tantalum nitride (TaN), tungsten nitride (WN), titanium (Ti), tantalum (Ta), tungsten (W), or a combination thereof.

The word line capping layer 1040 may be formed on the word line WL in an upper portion of the recess. An upper surface of the word line capping layer 1040 may be formed to be substantially coplanar with an upper surface of the substrate 1010. The word line capping layer 1040 may include, e.g., silicon oxide, silicon nitride, silicon oxynitride, or a combination thereof.

A first source/drain area SD1 and a pair of second source/drain areas SD2 may be formed by injecting impurities into portions of the plurality of active regions ACT on both sides of the word lines WL. The first source/drain region SD1 may be in the center of each of the plurality of active regions ACT, and the pair of second source/drain regions may be at both, e.g., opposite, ends of each of the plurality of active regions ACT. The first source/drain region SD1 may be between a pair of word lines WL, and the pair of second source/drain regions SD2 may be spaced apart from each other by the pair of word lines WL.

The word line WL, the first source/drain region SD1, and one of the pair of second source/drain regions SD2 may form one transistor TR. Two transistors TR may share one first source/drain region SD1. In FIG. 11B, the transistor TR may be a buried channel array transistor (BCAT), or the transistor TR may be one of transistors having various structures, such as a transistor having a planar structure, a vertical channel array transistor (VCAT), or the like.

A first interlayer insulating layer 1050 may be formed on the substrate 1010. The first interlayer insulating layer 1050 may include, e.g., silicon oxide, silicon nitride, silicon oxynitride, a low-k material, or a combination thereof. For example, the first interlayer insulating layer 1050 may include a high-density plasma (HDP) oxide film, tetraethyl orthosilicate (TEOS), plasma enhanced TEOS (PE-TEOS), ozone ($O_3$)-TEOS, undoped silicate glass (USG), phosphosilicate glass (PSG), borosilicate glass (BSG), borophosphosilicate glass (BPSG), fluoride silicate glass (FSG), spin on glass (SOG), tonen silazane (TOSZ), or a combination thereof.

A bit line contact BLC may be formed to penetrate the first interlayer insulating layer 1050 and connect each of the plurality of bit lines BL to the first source/drain region SD1. The bit line contact BLC may include polysilicon, a metal, a metal nitride, a metal-semiconductor compound, or a combination thereof.

Each of the plurality of bit lines BL may be formed on the bit line contact BLC. Each of the plurality of bit lines BL may extend in a second direction D2. Each of the plurality of bit lines BL may include, e.g., polysilicon, a metal, a metal nitride, a metal-semiconductor compound, or a combination thereof.

A bit line capping layer 1070 may be formed on the bit line BL. The bit line capping layer 1070 may include, e.g., silicon nitride, silicon oxide, silicon oxynitride, or a combination thereof.

A second interlayer insulating layer 1060 may be formed on the first interlayer insulating layer 1050, the bit line BL, and the bit line capping layer 1070. The second interlayer insulating layer 1060 may include, e.g., silicon oxide, silicon nitride, silicon oxynitride, a low-k material, or a combination thereof. For example, the second interlayer insulating layer 1060 may include an HDP oxide film, TEOS, PE-TEOS, $O_3$-TEOS, USG, PSG, BSG, BPSG, FSG, SOG, TOSZ, or a combination thereof.

A plurality of capacitor contacts CC may be formed to penetrate the second interlayer insulating layer 1060 and the first interlayer insulating layer 1050, and respectively connect the plurality of capacitors CA to the plurality of second source/drain regions SD2. The plurality of capacitor contacts CC may include, e.g., doped polysilicon, a metal, a metal compound, or a combination thereof.

The plurality of capacitors CA may be formed on the second interlayer insulating layer 1060 according to the method 100 of fabricating a capacitor described with reference to FIG. 1. Accordingly, the semiconductor device 1000 may be fabricated.

As described above, embodiments may provide a method of fabricating a capacitor having an improved capacitance, and a semiconductor device including the capacitor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a capacitor, the method comprising:
   forming a first electrode;
   forming a dielectric layer on the first electrode;
   forming a second electrode on the dielectric layer; and
   applying, between the first electrode and the second electrode, a voltage outside an operating voltage range applied during operation or a current outside an operating current range applied during operation.

2. The method as claimed in claim 1, wherein the applying, between the first electrode and the second electrode, of the voltage outside the operating voltage range applied during operation or the current outside the operating current range applied during operation increases a dielectric constant of the dielectric layer.

3. The method as claimed in claim 1, wherein the applying, between the first electrode and the second electrode, of the voltage outside the operating voltage range applied during operation or the current outside the operating current range applied during operation is performed under a condition that a magnitude of a leakage current of the capacitor does not exceed a predetermined value.

4. The method as claimed in claim 1, wherein the applying, between the first electrode and the second electrode, of the voltage outside the operating voltage range applied during operation or the current outside the operating current range applied during operation increases a proportion of a particular crystal phase in the dielectric layer.

5. The method as claimed in claim 4, wherein the particular crystal phase includes at least one of an orthorhombic phase (O-phase) and a tetragonal phase (T-phase).

6. The method as claimed in claim 1, wherein:
   the dielectric layer includes a ferroelectric material, and
   the voltage outside the operating voltage range is greater than a coercive voltage of the ferroelectric material.

7. The method as claimed in claim 1, further comprising heat-treating the dielectric layer to crystallize the dielectric layer.

8. The method as claimed in claim 1, further comprising:
forming a lower structure including a transistor; and
wherein the first electrode, the dielectric layer, and the second electrode are formed on the lower structure and connected to the transistor.

9. A method of fabricating a capacitor, the method comprising:
forming a first electrode;
forming a dielectric layer on the first electrode;
forming a second electrode on the dielectric layer; and
applying a voltage or a current between the first electrode and the second electrode,
wherein the applying of the voltage or the current between the first electrode and the second electrode includes:
applying a voltage sweep or a voltage pulse having a maximum voltage outside an operating voltage range applied during operation or a current sweep, or
applying a current pulse having a maximum current outside an operating current range applied during operation.

10. The method as claimed in claim 9, wherein:
the dielectric layer includes a ferroelectric material that includes $Hf_xZr_{1-x}O_2$ in which $0 \leq x \leq 1$, doped with at least one of N, Ta, Si, Ge, La, Y, Sc, Sr, Al, and Gd.

11. The method as claimed in claim 9, wherein the maximum voltage is greater than 0.5 V and less than or equal to 5 V.

12. The method as claimed in claim 9, wherein the maximum current is about 5 picoamperes (pA) to about 50 milliamperes (mA).

13. The method as claimed in claim 9, wherein a time for which the voltage or the current is applied between the second electrode and the first electrode is about 1 nanosecond (ns) to about 1 second (s).

14. The method as claimed in claim 9, wherein:
the capacitor does not exhibit hysteresis when a voltage sweep having a maximum voltage within the operating voltage range is applied, and
the capacitor exhibits hysteresis when a voltage sweep having a maximum voltage outside the operating voltage range is applied.

15. The method as claimed in claim 9, wherein a thickness of the dielectric layer is about 3 nm to about 20 nm.

16. A method of fabricating a capacitor, the method comprising:
forming a first electrode;
forming a dielectric layer on the first electrode;
forming a second electrode on the dielectric layer; and
applying, between the first electrode and the second electrode, a voltage outside an operating voltage range applied during operation or a current outside an operating current range applied during operation,
wherein the applying, between the first electrode and the second electrode, of the voltage outside the operating voltage range applied during operation or the current outside the operating current range applied during operation increases a capacitance of the capacitor.

17. The method as claimed in claim 16, wherein the applying, between the first electrode and the second electrode, of the voltage outside the operating voltage range applied during operation or the current outside the operating current range applied during operation increases capacitance of the capacitor by more than 0% and less than or equal to 10%.

18. The method as claimed in claim 16, wherein the applying, between the first electrode and the second electrode, of the voltage outside the operating voltage range applied during operation or the current outside the operating current range applied during operation does not increase a leakage current of the capacitor 10 times or more in the operating voltage range.

19. The method as claimed in claim 16, wherein the applying, between the first electrode and the second electrode, of the voltage outside the operating voltage range applied during operation or the current outside the operating current range applied during operation is performed under a condition that a magnitude of a leakage current of the capacitor does not fall outside of a range of about 2 femtoamperes (fA) to about 1 picoamperes (pA).

20. The method as claimed in claim 16, wherein, after the applying, between the first electrode and the second electrode, of the voltage outside the operating voltage range applied during operation or the current outside the operating current range applied during operation, a proportion of an orthorhombic phase in the dielectric layer is about 30% to about 100%.

* * * * *